(12) United States Patent
Dong et al.

(10) Patent No.: US 11,360,385 B1
(45) Date of Patent: Jun. 14, 2022

(54) EYEPIECE ASSEMBLY ADHESION USING A ZERO RESIDUAL LAYER REGION

(71) Applicant: Magic Leap, Inc., Plantation, FL (US)

(72) Inventors: Huihang Dong, Weston, FL (US); Thomas Mercier, Weston, FL (US); Vikramjit Singh, Pflugerville, TX (US); Kang Luo, Austin, TX (US); Tasha Amit Mangaldas, Fort Lauderdale, FL (US); William Hudson Welch, Fort Lauderdale, FL (US); Qizhen Xue, Austin, TX (US); Frank Y. Xu, Austin, TX (US)

(73) Assignee: Magic Leap, Inc., Plantation, FL (US)

( * ) Notice: Subject to any disclaimer, the term of this patent is extended or adjusted under 35 U.S.C. 154(b) by 156 days.

(21) Appl. No.: 16/518,547

(22) Filed: Jul. 22, 2019

Related U.S. Application Data

(60) Provisional application No. 62/702,508, filed on Jul. 24, 2018.

(51) Int. Cl.
*G03F 7/00* (2006.01)
(52) U.S. Cl.
CPC .......... *G03F 7/0005* (2013.01); *G03F 7/0002* (2013.01)

(58) Field of Classification Search
CPC ............................ G03F 7/0002; G03F 7/0005
See application file for complete search history.

(56) References Cited

U.S. PATENT DOCUMENTS

| 4,839,497 | A | * | 6/1989 | Sankar | B23K 26/0604 |
| | | | | | 219/121.71 |
| 2007/0284779 | A1 | * | 12/2007 | Wu | B29C 37/005 |
| | | | | | 264/293 |
| 2011/0020617 | A1 | * | 1/2011 | Kawaguchi | G03F 7/027 |
| | | | | | 428/195.1 |
| 2015/0276369 | A1 | * | 10/2015 | Kneezel | G03F 9/7053 |
| | | | | | 324/693 |

* cited by examiner

*Primary Examiner* — Alex A Rolland
(74) *Attorney, Agent, or Firm* — Fish & Richardson P.C.

(57) ABSTRACT

Methods and systems for manufacturing an optical waveguide include depositing an adhesion promoting layer on a substrate. Multiple curable resist droplets are dispensed on the adhesion promoting layer. The adhesion promoting layer is disposed between and contacts the substrate and the curable resist droplets. The curable resist droplets define an optical eyepiece layer such that a zero residual layer thickness (RLT) region of the optical eyepiece layer is free of the curable resist droplets. The optical eyepiece layer is incised from the substrate to form the optical waveguide.

19 Claims, 11 Drawing Sheets

EYEPIECE ASSEMBLY ADHESION USING A ZERO RESIDUAL LAYER REGION

CROSS-REFERENCE TO RELATED APPLICATION

This application claims the benefit of U.S. Provisional Application 62/702,508, filed on Jul. 24, 2018, which is incorporated herein by reference in its entirety.

TECHNICAL FIELD

This disclosure relates to manufacturing an optical waveguide by selectively dispensing curable resist droplets on a substrate.

BACKGROUND

Imprint lithography is used to fabricate nanometer-scale patterns on wafers. However, a layer of imprint resist material used by traditional lithography methods may react with a layer of stacking glue material, thus reducing the shear strength of the fabricated product. Stacked optical structures manufactured using traditional lithography methods may therefore suffer delamination and yield loss. Moreover, the layer of imprint resist material may result in scattered light due to non-uniformity and a lower diffraction index. Uncontrolled light scatter in traditional lithography methods may bounce back, reducing image quality, sharpness, and uniformity.

SUMMARY

Innovative aspects of the subject matter described in this specification include a method of manufacturing an optical waveguide. The method includes depositing an adhesion promoting layer on a substrate. Multiple curable resist droplets are dispensed on the adhesion promoting layer. The adhesion promoting layer is disposed between and contacts the substrate and the curable resist droplets. The curable resist droplets define an optical eyepiece layer such that a zero residual layer thickness (RLT) region of the optical eyepiece layer is free of the curable resist droplets. The optical eyepiece layer is incised from the substrate to manufacture the optical waveguide.

Innovative aspects of the subject matter described in this specification further include a system for manufacturing an optical waveguide. The system includes a vapor deposition machine configured to deposit an adhesion promoting layer on a substrate. The system further includes a fluid dispenser configured to dispense multiple curable resist droplets on the adhesion promoting layer. The adhesion promoting layer is disposed between and contacts the substrate and the curable resist droplets. The curable resist droplets define an optical eyepiece layer such that a zero RLT region of the optical eyepiece layer is free of the curable resist droplets. The system further includes a controller configured to incise, by a laser beam, the optical eyepiece layer from the substrate to manufacture the optical waveguide.

Innovative aspects of the subject matter described in this specification further include an optical structure for manufacturing an optical waveguide. The optical structure includes a substrate and an adhesion promoting layer deposited on the substrate. Multiple curable resist droplets are disposed on the adhesion promoting layer. The adhesion promoting layer is disposed between and contacts the substrate and the curable resist droplets. The curable resist droplets define an optical eyepiece layer such that a zero RLT region of the optical eyepiece layer is free of the curable resist droplets.

Among other advantages and benefits of the embodiments disclosed herein, the scattering of light at the edges of each optical eyepiece layer is reduced compared to traditional lithography methods. Because there is no imprint resist material on the edges of each eyepiece layer, a laser beam can make direct contact with the substrate for incision. The sharpness of the optics is thereby improved compared to traditional lithography methods. The presence of particle defects is reduced on the zero RLT region of the optical eyepiece layer compared to traditional lithography methods. The absence of imprint resist reduces the formation of amplified imprint defects and increases the product quality and optical performance compared to traditional lithography methods. Moreover, a mechanically stable and hermetically sealed encapsulation is achieved from the improved adhesion at the adhesion promoting layer disposed on the substrate. A bond at the exposed portion of the adhesion promoting layer provides improved protection of the sensitive internal optical structures from environmental influences and results in longer-term stability and reliability of the optical elements and compatibility with the surrounding periphery. The embodiments disclosed herein therefore provide an imprint lithography process having lower cost, higher throughput, and higher resolution. A three-dimensional patterning process can be used and imprint molds can be fabricated with multiple layers of topography stacked vertically. The resulting imprints replicate multiple layers in a single imprint step, which allows optics manufacturers to reduce particle defects and fabrication costs, and improve optical performance compared to traditional lithography methods.

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF THE DRAWINGS

Figure (FIG. 1 illustrates an example side view of a lithography system.

DETAILED DESCRIPTION

Imprint lithography is used to fabricate nanometer-scale patterns on wafers. Imprint lithography can create optical patterns by mechanical deformation of imprint resist. However, using traditional lithography methods, when a layer of imprint resist material is deposited on top of a non-grating pattern area of an optical eyepiece, the imprint resist may react with stacking glue material, thus reducing the adhesion and shear strength of the fabricated product. When stacked optical structures are manufactured and handled downstream using traditional lithography methods to build a final product, delamination and yield loss may therefore occur. Moreover, a layer of dummy imprint resist material on top of the non-grating pattern area may result in scattered light due to non-uniformity and a lower diffraction index. Uncontrolled light scatter in traditional lithography methods may bounce back from the optical structure, reducing image quality, sharpness, and uniformity.

This document describes methods and systems for manufacturing an optical waveguide by selectively dispensing curable resist droplets on a substrate. The manufacturing of the optical waveguide includes depositing an adhesion promoting layer on the substrate. The curable resist droplets are selectively dispensed on the adhesion promoting layer in accordance with a resist drop pattern to form a diffraction grating of the optical waveguide. The adhesion promoting layer is disposed between and contacts the substrate and the dispensed curable resist droplets. The curable resist droplets are dispensed on a region of the substrate corresponding to an optical eyepiece layer of the optical waveguide. A zero residual layer thickness (RLT) region of the optical eyepiece layer that corresponds to an edge of the optical eyepiece layer is free of the curable resist droplets. The absence of the curable resist droplets from the edge of the optical eyepiece layer provides reduced particle defects, improved sharpness of images using the optical waveguide, and improved optical performance compared to traditional lithography methods. Moreover, the improved adhesion at the adhesion promoting layer provides improved protection of the sensitive internal optical structures from environmental influences compared to traditional lithography methods.

Example Lithography System

Figure 1:
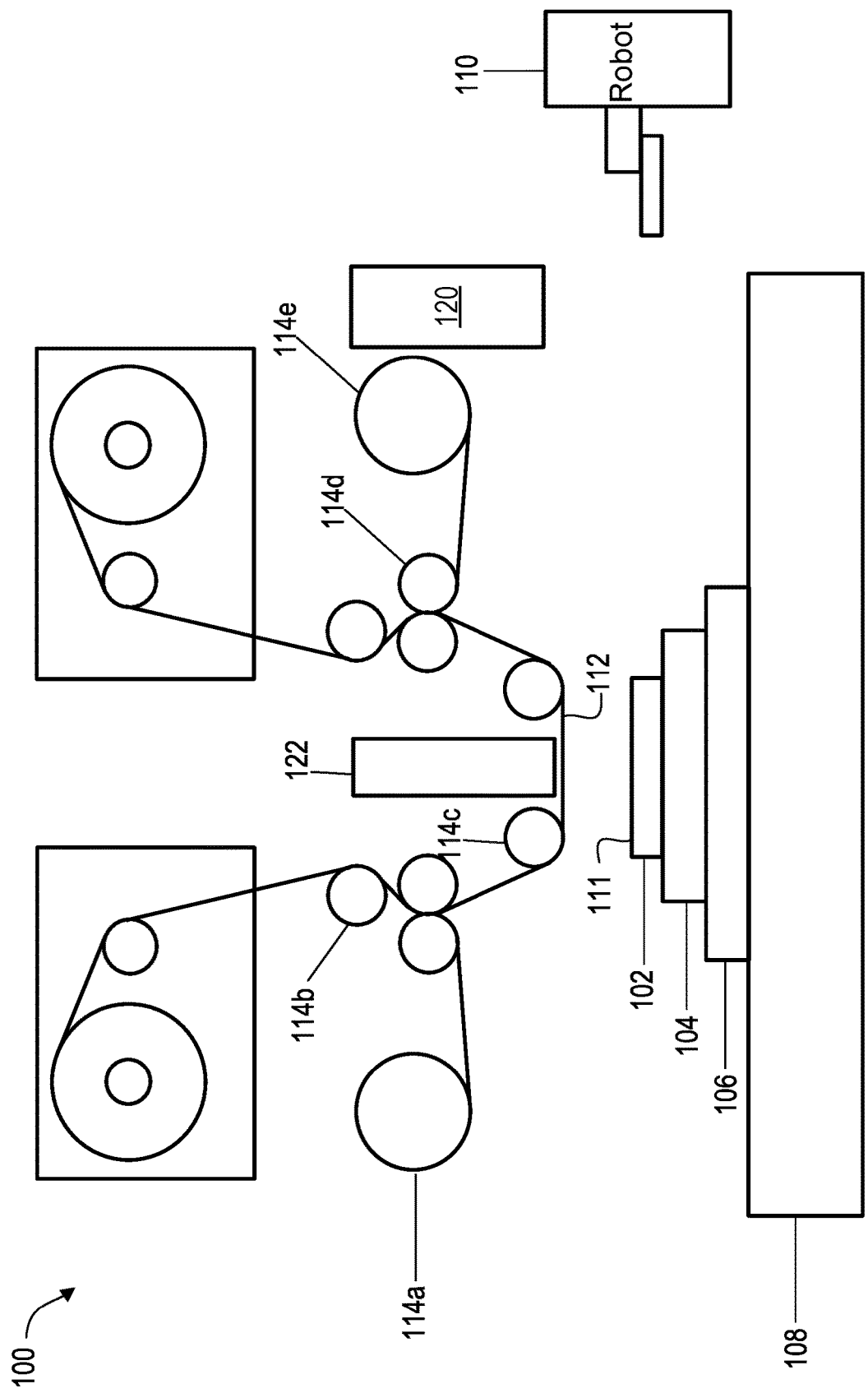

FIG. 1 illustrates an example side view of a lithography system 100. The lithography system 100 forms a relief pattern on a substrate 102. For example, the substrate 102 can include glass or silicon. The substrate 102 can be coupled to a substrate chuck 104. In some embodiments, the substrate chuck 104 includes a vacuum chuck, a pin-type chuck, a groove-type chuck, or an electromagnetic chuck. In some embodiments, the substrate 102 and the substrate chuck 104 are positioned on an air bearing 106. The air bearing 106 provides motion about the x-, y-, and/or z-axes. In some embodiments, the substrate 102 and the substrate chuck 104 are positioned on a base. The air bearing 106, the substrate 102, and the substrate chuck 104 can also be positioned on a stage 108. In some embodiments, a robot 110 positions the substrate 102 on the substrate chuck 104.

The lithography system 100 further includes a flexible, coated resist template 112 that can be coupled to one or more rollers 114a, 114b, 114c, 114d, or 114e. The rollers provide movement of a least a portion of the flexible, coated resist template 112. Such movement can selectively superimpose different portions of the flexible, coated resist template 112 onto the substrate 102. In some embodiments, the flexible, coated resist template 112 includes a patterning surface that includes multiple patterning features, e.g., spaced-apart recesses and protrusions. The patterning surface can define any arbitrary pattern to be imprinted on the substrate 102. In some embodiments, the flexible, coated resist template 112 is coupled to a template chuck, e.g., a vacuum chuck, a pin-type chuck, a groove-type chuck, or an electromagnetic chuck.

The lithography system 100 further includes a fluid dispenser 120. The fluid dispenser 120 can be used to deposit a polymerizable material on the substrate 102. The polymerizable material can be positioned upon the substrate 102 using drop dispense, spin-coating, dip coating, chemical vapor deposition, physical vapor deposition, thin film deposition, or thick film deposition. In some embodiments, the polymerizable material is positioned upon the substrate 102 in the form of multiple curable resist droplets. The lithography system 100 can further include an energy source 122 to direct energy (e.g., broadband ultraviolet radiation) towards the substrate 102. In some embodiments, the rollers and the air bearing 106 are configured to position a desired portion of the flexible, coated resist template 112 and the substrate 102 to receive the energy. The lithography system 100 can be regulated by a controller in communication with the air bearing 106, the rollers, the fluid dispenser 120, and/or the energy source 122. An example controller is illustrated and described in more detail below with reference to FIG. 2B.

Example Substrate Having a Patterned Layer

Figure 2A:
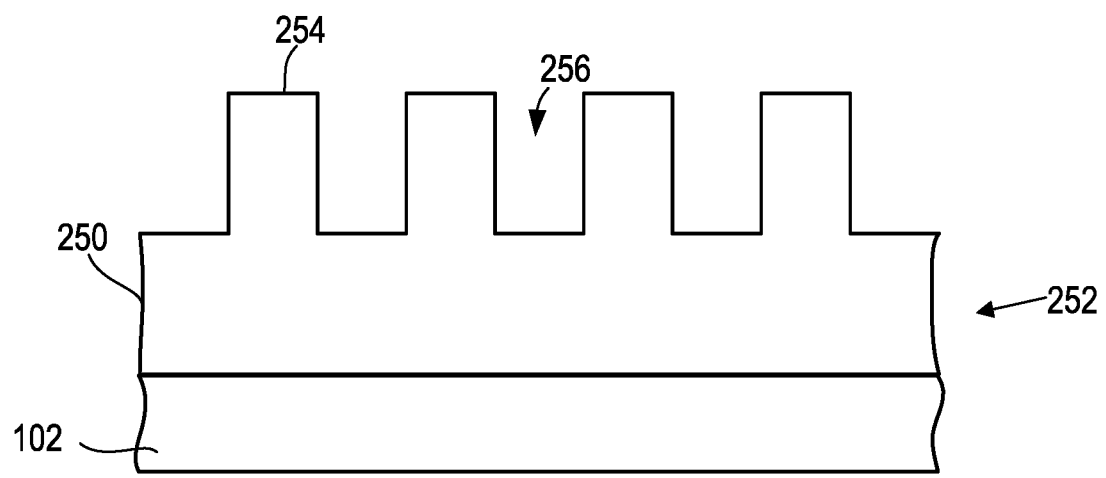
FIG. 2A illustrates an example side view of a substrate having a patterned layer positioned thereon.

FIG. 2A illustrates an example side view of a substrate 102 having a patterned layer 250 positioned thereon. In some embodiments, the rollers or the air bearing 106 shown in FIG. 1 above are used to vary a distance between the flexible, coated resist template 112 and the substrate 102 to define a desired volume therebetween that is filled by polymerizable material. The flexible, coated resist template 112 thus directly contacts the polymerizable material. After the desired volume is filled by the polymerizable material, the energy source 122 produces energy, e.g., broadband ultraviolet radiation, causing the polymerizable material to solidify and/or cross-link conforming to a shape of a surface of the substrate 102 and a portion of the patterning surface of the flexible, coated resist template 122. The cured polymerizable material thus defines a patterned layer 250 on the substrate 102. In some embodiments, the patterned layer 250 includes a residual layer 252 and multiple patterning features shown as protrusions 254 and recessions 256 in FIG. 2A.

Example Lithography System for Manufacturing an Optical Waveguide

Figure 2B:
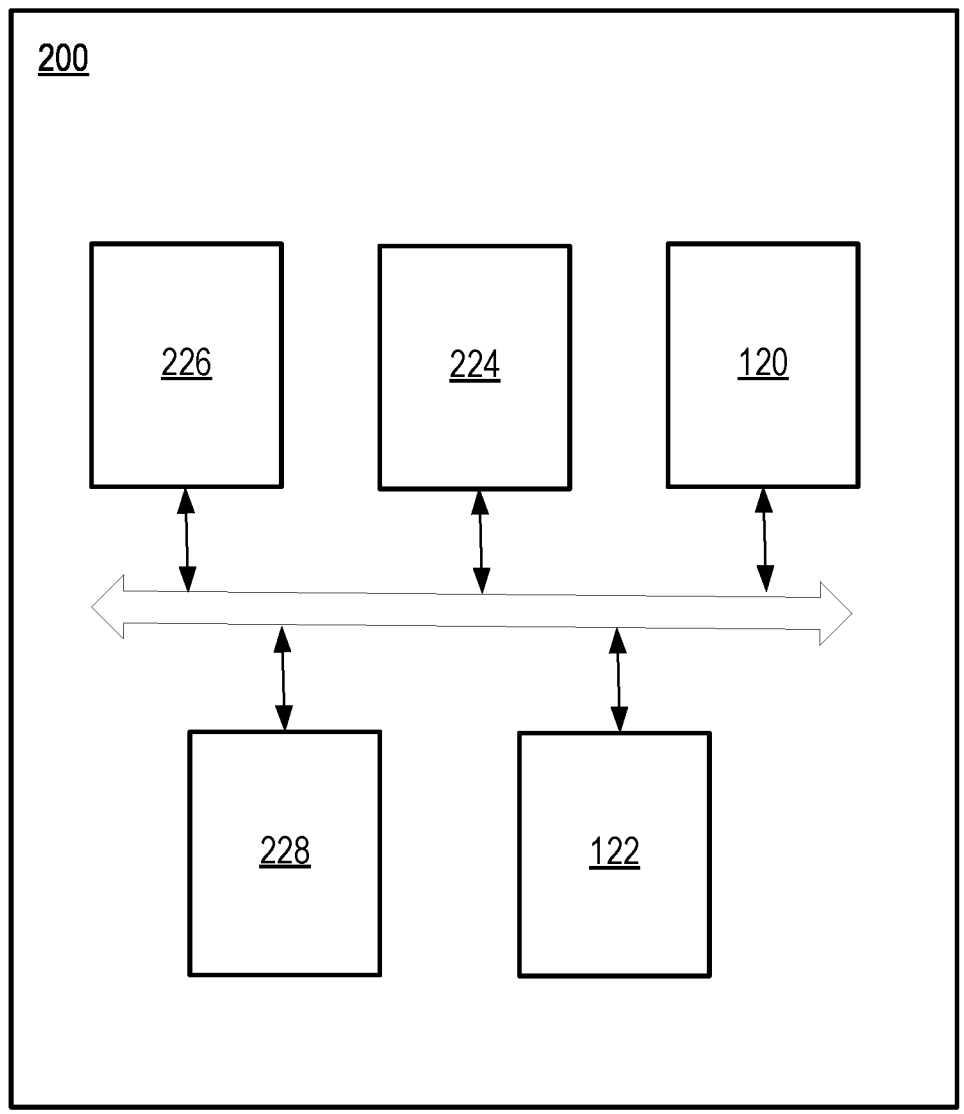
FIG. 2B illustrates an example lithography system for manufacturing an optical waveguide.

FIG. 2B illustrates an example lithography system 200 for manufacturing an optical waveguide. The lithography system 200 includes a vapor deposition machine 226, a controller 224, a fluid dispenser 120, a laser 228, and an energy source 122. The lithography system 200 can be used to manufacture a multi-layered waveguide structure stacked to intercept light passing sequentially through each waveguide. Each waveguide can be associated with a differing color and a differing depth of plane.

The vapor deposition machine 226 is configured to deposit an adhesion promoting layer on a substrate (e.g., the substrate 102). The vapor deposition machine 226 can be used to produce a thin film or coating of the adhesion promoting layer on the substrate 102. For example, the adhesion promoting layer can be transformed from a condensed phase to a vapor phase and then back to a thin film condensed phase onto the substrate 102 using sputtering or evaporation. The adhesion promoting layer is intended to improve the adhesion of curable resist droplets to the substrate 102. The vapor deposition machine 226 can apply the adhesion promoting layer by spinning a diluted solution on to the substrate 102 and allowing the solution to spin dry.

The fluid dispenser 120 dispenses a thin layer of imprint resist (e.g., thermoplastic polymer) in the form of curable droplets onto the adhesion promoting layer. The adhesion promoting layer is thus disposed between and directly contacts the substrate 102 and the dispensed curable resist droplets. The curable resist droplets define an optical eyepiece layer of the waveguide. The curable resist droplets are selectively dispensed such that an edge of the optical eyepiece layer is free of the curable resist droplets. The edge of the optical eyepiece layer corresponds to a zero RLT region of the optical eyepiece layer, where the thickness of the residual imprint resist is zero.

In some embodiments, the fluid dispenser 120 dispenses the curable resist droplets on the adhesion promoting layer by injecting the curable resist droplets at predefined coordinates and a predefined frequency. The injection of the curable resist droplets thus causes adjacent pairs of droplets to have a predefined separation (XY pitch) on the adhesion promoting layer. For example, the fluid dispenser 120 can be programmed with a resist drop pattern to indicate points or regions where the imprint resist is to be or is not to be dispensed. The resist drop pattern can further define multiple void fiducials to monitor the placement of the imprint resist. A high-resolution resist drop pattern can be programmed that includes predefined coordinates for individual resist droplets and a predefined XY pitch between adjacent pairs of droplets. The curable resist droplets are therefore dispensed on the adhesion promoting layer at predefined coordinates and a predefined frequency, such that at least two adjacent droplets of the curable resist droplets have a predefined separation on the adhesion promoting layer.

In some embodiments, the fluid dispenser 120 includes inkjet heads that propel the curable resist droplets onto the substrate. One or more inkjet heads of the fluid dispenser 120 are translated relative to the substrate. For example, the fluid dispenser 120 can operate at a high frequency while dispensing the curable resist droplets while the substrate 102 is positioned and moved under the inkjet heads. Ultra-high resolution and precision (X, Y, volume) are achieved by the inkjet dispense frequency, head voltage, and stage movement control. The curable resist droplets can be injected on the adhesion promoting layer by moving the inkjet heads of the fluid dispenser 120 across the substrate 102, moving the substrate 102 across the inkjet heads of the fluid dispenser 120, or moving the inkjet heads of the fluid dispenser 120 and the substrate 102 across each other.

The lithography system 200 can be regulated by a controller 224 in communication with the vapor deposition machine 126, the fluid dispenser 120, the laser 228, and/or the energy source 122. In some embodiments, the controller 224 operates on a computer-readable program stored in a computer memory. The controller 224 can be implemented in software, hardware, or a combination thereof. For example, the controller 224 can be part of a personal computer (PC), a tablet PC, an internet of things (IoT) appliance, or any other machine capable of executing instructions that specify actions to be taken by that machine.

In some embodiments, the controller 224 instantiates void fiducials in the optical structure being manufactured to monitor the dispensing of the curable resist droplets within the optical eyepiece layer. The controller 224 instantiates void fiducials on the substrate 102 to determine whether the curable resist droplets are being dispensed in accordance with the resist drop pattern. The controller 224 also instantiates fiducial markers in the optical eyepiece layer by superimposing a coated resist template (e.g., the flexible, coated resist template 112 of FIG. 1) onto the curable resist droplets. Void fiducials and fiducial markers are markers that can be placed in a field of view of an optical structure for use as a point of reference or a measure. The void fiducials can be placed into or on the imaging subject or on a mark or set of marks in the optical structure.

The controller 224 superimposes the flexible, coated resist template 112 onto the curable resist droplets to contact and pattern the curable resist droplets. The flexible, coated resist template 112 includes a patterning surface comprising one or more recesses and protrusions. An example recess 256 and protrusion 254 is illustrated and described in more detail above with reference to FIG. 2A. The flexible, coated resist template 112 can further include a deep grating structure or dam configured to prevent the curable resist droplets from flowing into the zero RLT region of the optical eyepiece layer. The deep grating structure or dam has ridges or rulings having a raised height that physically prevent the curable resist droplets from flowing into the zero RLT region of the optical eyepiece layer.

The controller 224 is configured to direct energy (e.g., broadband ultraviolet radiation) from an energy source 122 to cure the curable resist droplets. After the imprint resist is cured, the controller 224 removes the flexible, coated resist template 112 to expose the patterned resist, which then conforms to a portion of the patterning surface of the flexible, coated resist template 112. The cured, patterned imprint resist forms a diffraction grating of the waveguide for diffraction of light to generate an image using the eyepiece. The diffraction gratings diffract light traveling through the optical waveguide. In some embodiments, the diffraction grating formed on the optical structure is etched to manufacture the optical eyepiece layer. In other embodiments, the need to dry etch the substrate 102 (e.g., dry etching high-index glass or sapphire) is abrogated. In some embodiments, the substrate 102 can be partially etched (e.g., using a plasma process under atmospheric or low pressure conditions) to remove a residual imprint layer and/or transfer the grating pattern into the substrate 102 while maintaining a portion of the residual imprint layer on a surface of the substrate 102. While the imprint resist can be removed by laser ablation in one embodiment, in other embodiments the imprint resist is simply not placed on the substrate 102 (e.g., by masking), etched off (e.g., by plasma), or a combination thereof.

The controller 224 is further configured to direct a laser beam from the laser 228 onto a portion of the adhesion promoting layer to incise the substrate 102. An example laser beam 605 is illustrated and described below with reference to FIG. 6A. The optical eyepiece layer can be incised from the substrate 102 by pulsing the laser beam onto the adhesion promoting layer to generate nanoperforations in the substrate 102. The laser beam is applied to the generated nanoperforations to expand the nanoperforations and separate the optical eyepiece layer from the substrate 102. The optical eyepiece layer can be bonded to a second optical eyepiece layer imprinted on a second substrate to manufacture the optical waveguide.

The laser 228 provides the laser beam to incise the substrate 102. In some embodiments, the laser 228 includes a gain medium, an energizing mechanism, and an optical feedback mechanism to generate the laser beam. The gain medium is a material with properties that allow the laser 228 to amplify light by way of stimulated emission. The laser 228 can use feedback from an optical cavity, and can affect properties of the emitted light, such as the polarization, wavelength, and shape of the laser beam.

The energy source 122 provides radiation to strengthen (e.g., polymerize, cure, or cross-link) the curable resist droplets, leaving behind an imprint resist coating on the substrate 102. In some embodiments, the energy source 122 decreases a wavelength of the radiation to achieve a higher resolution. For example, the energy source 122 can provide the energy at wavelengths in the ultraviolet spectrum or shorter (<400 nm) or the deep ultraviolet spectrum.

Optical Structure Having Optical Eyepiece Layer

Figure 3:
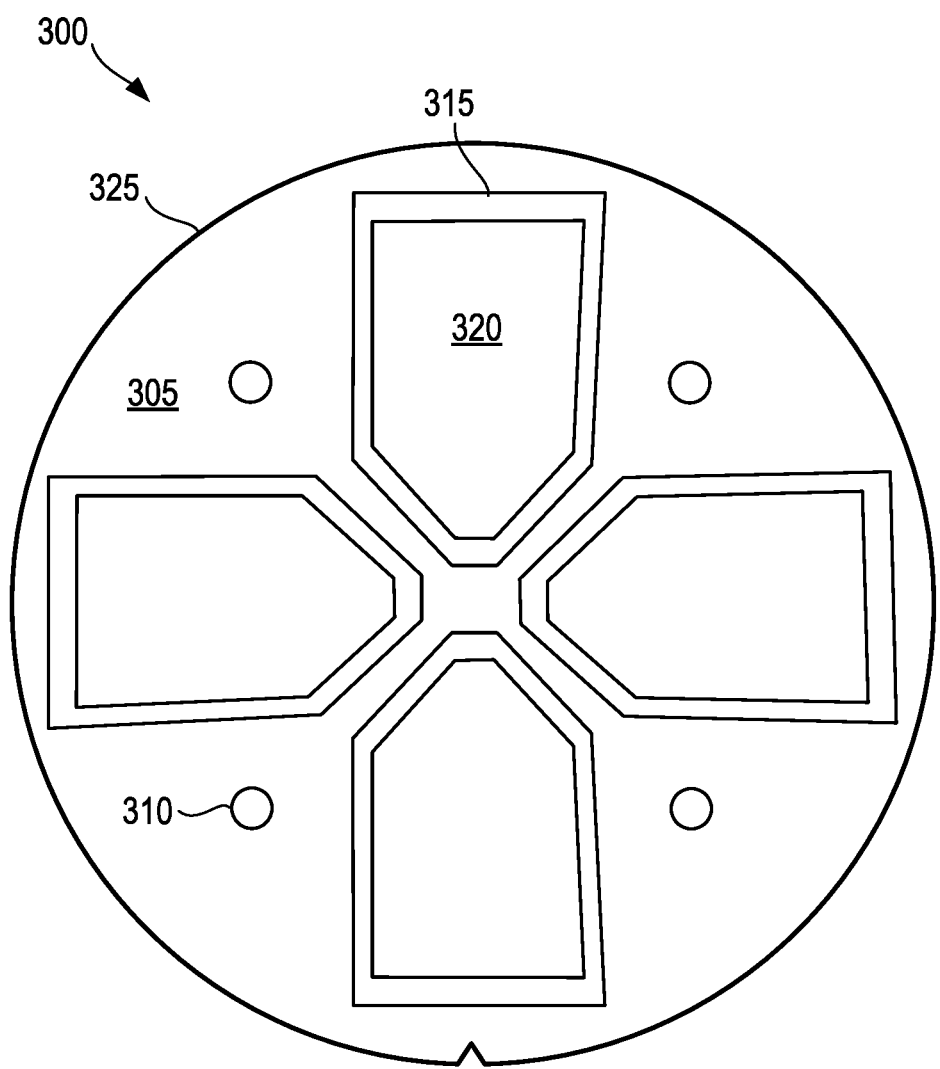
FIG. 3 illustrates a planar view of an optical structure having an optical eyepiece layer.

FIG. 3 illustrates a planar view of an optical structure 300 having an optical eyepiece layer 320. The optical structure 300 includes a substrate 325, a resist dispense region 305, a void fiducial 310, and the optical eyepiece layer 320. The optical eyepiece layer 320 has an edge 315 corresponding to a zero RLT region.

The optical structure 300 is manufactured by depositing an adhesion promoting layer on the substrate 325. The substrate 325 is made of a high refractive index material, such as glass or silicon. Curable resist droplets are dispensed on the adhesion promoting layer in accordance with a programmed resist drop pattern to form the optical eyepiece layer 320. A first region of the resist drop pattern defines the optical eyepiece layer 320 and a second region of the resist drop pattern defines the edge 315. The edge 315 of the optical eyepiece layer 320 is free of the curable resist droplets. In some embodiments, the dispensing of the curable resist droplets includes injecting the curable resist droplets onto the substrate 325 at predefined coordinates and a predefined frequency. The injection of the curable resist droplets thus causes pairs of adjacent droplets to have a predefined separation. The fluid dispenser 120 performs steps to translate the inkjet heads of the fluid dispenser 120 relative to the substrate 325. For example, the curable resist droplets can be injected on the adhesion promoting layer by moving the inkjet heads of the fluid dispenser 120, moving the substrate 325 across the inkjet heads of the fluid dispenser 120, or moving the inkjet heads of the fluid dispenser 120 and the substrate 325 across each other.

In some embodiments, the void fiducial 310 is instantiated in the optical structure 300 to monitor the dispensing of the curable resist droplets within the optical eyepiece layer 320. Because the second region of the resist drop pattern defining the edge 315 of the optical eyepiece layer 320 is free of the curable resist droplets, the optical performance of the optical waveguide is increased by reducing the scattering of light at the edge 315 and reducing a number of particle defects on the zero RLT region of the optical eyepiece layer 320 compared to traditional lithography methods. The zero RLT region of the optical eyepiece layer 320 corresponds to the edge 315. The thickness of the imprint residual layer can be determined by various process parameters including the initial thickness of the applied imprint resist material, the viscosity of the imprint resist, the imprint pressure, and the structure of the imprint coated resist template and pattern area. A uniform and reduced-thickness residual imprint layer achieved using the embodiments disclosed herein reduces the number of imprint defects and improves optical performance of the optical waveguide compared to traditional lithography methods.

Optical Structure Having Diffraction Grating

Figure 4:
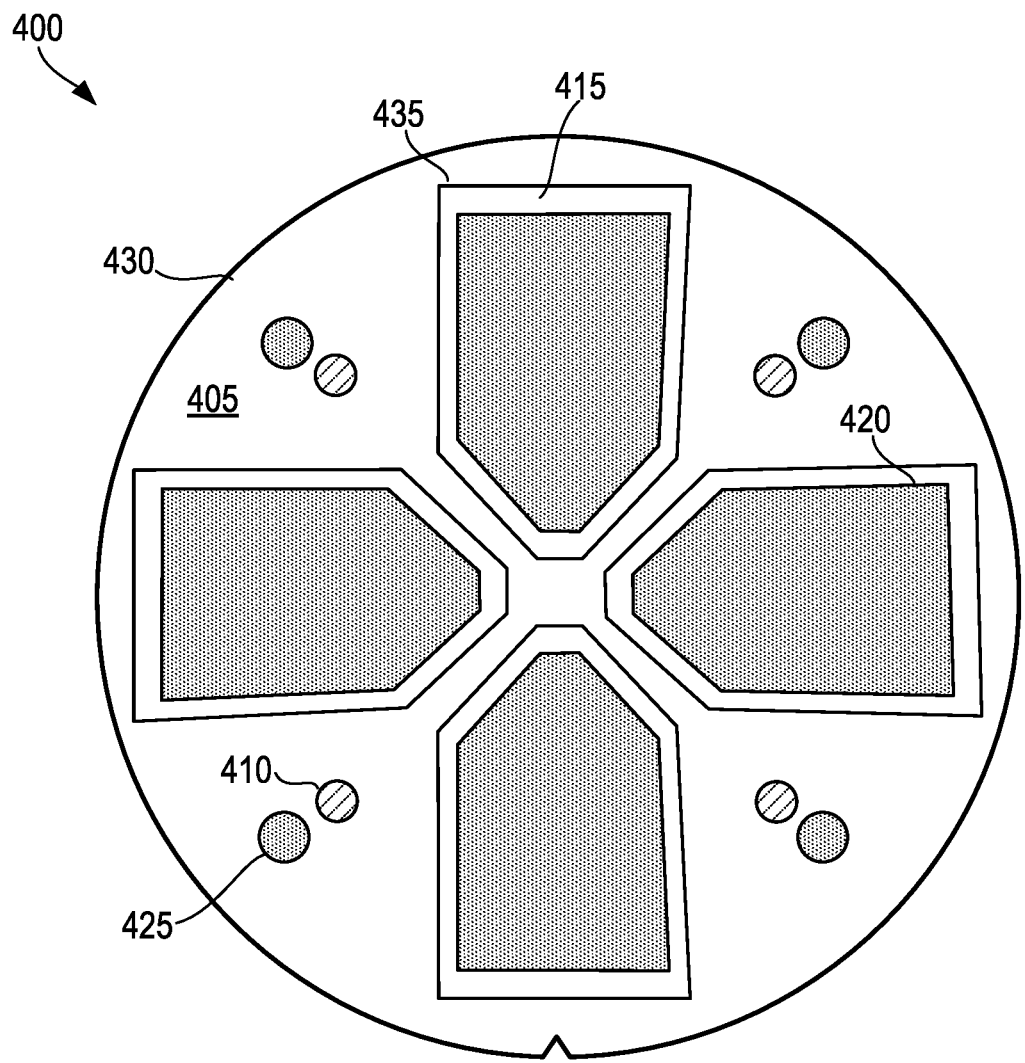
FIG. 4 illustrates a planar view of an optical structure having a diffraction grating.

FIG. 4 illustrates a planar view of an optical structure 400 having a diffraction grating 420. The optical structure 400 includes a substrate 430, a resist dispense region 405, a void fiducial 410, an optical eyepiece layer 435, the diffraction grating 420, and a fiducial marker 425. The optical eyepiece layer 435 has an edge 415 corresponding to a zero RLT region of the optical eyepiece layer 435.

The optical structure 400 is an intermediate device in a process of manufacturing an optical waveguide on the substrate 430. The process includes depositing an adhesion promoting layer on the substrate 430. Curable resist droplets are dispensed on the resist dispense region 405 to form a diffraction grating (e.g., the diffraction grating 420). The adhesion promoting layer is disposed between and directly contacts the substrate 430 and the dispensed curable resist droplets. For example, the resist drop pattern may include the diffraction grating 420 and a residual layer having a thickness less than 50 nanometers. The diffraction grating 420 can include a critical dimension of approximately 100 nanometers.

In some embodiments, the dispensing of the curable resist droplets includes injecting the curable resist droplets onto the adhesion promoting layer at predefined coordinates and a predefined frequency to cause a pair of adjacent droplets to have a predefined separation on the adhesion promoting layer. A zero RLT region of the optical eyepiece layer 435 that corresponds to the edge 415 of the optical eyepiece layer 435 is free of the curable resist droplets. The resist dispense region 405 is therefore wholly or partially excluded from the no-imprint pattern area (e.g., the edge 415) by defining the resist drop pattern area on the substrate 430. The non-grating pattern area (e.g., the edge 415) is thus omitted from the resist drop pattern, such that no or minimal imprint resist is dispensed at this location (the edge 415) during imprint. An alignment budget (e.g., ~250 μm) is designed to be sufficient to ensure that there is enough resist volume at the imprint diffraction grating area (e.g., the diffraction grating 420).

The diffraction grating 420 is an optical component having a periodic structure that splits and diffracts light into several beams travelling in different directions. The directions of these beams depend on the spacing of the diffraction grating 420 and the wavelength of the light, such that the diffraction grating 420 acts as a dispersive element. The diffraction grating 420 thus diffracts light traveling through the optical waveguide. The diffraction grating 420 can have ridges or rulings on the surface. In some embodiments, an interference pattern between two or more coherent light waves is set up and recorded in the imprint resist to form the diffraction grating 420. The interference pattern can include a periodic series of fringes representing intensity minima and maxima. In some embodiments, the diffraction grating 420 is etched to manufacture the optical eyepiece layer 435.

In some embodiments, the forming of the diffraction grating 420 includes superimposing a flexible, coated resist template onto the curable resist droplets to contact and pattern the curable resist droplets. Such a flexible, coated resist template 112 is illustrated and described in more detail above with reference to FIG. 1. The flexible, coated resist template 112 (also known as a submaster) makes direct contact with the imprint resist on top of the high-index substrate 430. In some embodiments, a deep grating structure or a dam is added to the flexible, coated resist template 112 to prevent the curable resist droplets from flowing into the zero RLT region of the optical eyepiece layer 435. The deep grating structure or dam has a larger pitch, such that there is reduced light interference on the red-green-blue (RGB) wavelength compared to traditional lithography methods. The flexible, coated resist template 112 is removed to expose the diffraction grating 420. The diffraction grating 420 conforms to a portion of the patterning surface of the flexible, coated resist template 112.

In some embodiments, the void fiducial 410 is instantiated on the substrate 430 in accordance with the resist drop pattern to monitor the dispensing of the curable resist droplets within the optical eyepiece layer 435. The void fiducial 410 is designed to monitor whether the process conforms to the resist drop pattern for field alignment to improve accuracy of the alignment process and avoid non-fill defects within the functioning area of the optical structure 400.

The fiducial marker 425 is instantiated to align the dispensed curable resist droplets with the void fiducial 410 defined by the resist drop pattern. The fiducial marker 425 can be instantiated in the field of view of the optical structure 400 for use as a point of reference. In some embodiments, the fiducial marker 425 can be instantiated on an opposite side of the optical eyepiece layer 435 rather than on the optically active side of the diffraction grating 420. The fiducial marker 425 can thus partially overlap the optically active diffraction grating 420, such that the fiducial marker 425 is visible to a camera viewing the optical structure 400 through the diffraction grating 420.

The fiducial marker 425 is instantiated by superimposing the flexible, coated resist template 112 onto the curable resist droplets. An offset is measured between the void fiducial 410 and the fiducial marker 425. The measured offset is corrected to align the zero RLT region of the optical eyepiece layer 435 with a deep grating structure or dam located on the flexible, coated resist template 112. The deep grating structure or dam corresponds to the edge 415 of the optical eyepiece layer 435. By measuring and correcting the offset between the void fiducial 410 and the fiducial marker 425 during the imprint process (i.e., the direct-contact submaster with the imprint resist on top of the substrate 430), the no-resist droplet zone on the substrate 430 is aligned with the dam structure on the edge 415 of the eyepiece layer from the submaster.

In an artificial reality application (e.g., augmented reality or mixed reality), the fiducial marker 425 improves integration between a real world view and synthetic images that augment the real world view. Fiducial markers of known patterns and sizes can serve as real world anchors of location, orientation and scale. They can establish the identity of the scene or objects within the scene. The fiducial marker 425 can also serve to moor the coordinates of the augmented content to the three dimensional location, orientation and scale, to create a stable and accurate fusion of real and synthetic imagery. In some embodiments, the diffraction grating 420 includes an orthogonal pupil expander, an exit pupil expander, or a multidirectional pupil expander.

The controller 224 directs a laser beam from the laser 228 onto a portion of the adhesion promoting layer to incise the optical eyepiece layer 435 from the substrate 430. The laser beam is laterally spaced from the diffraction grating 420, such that the diffraction grating 420 is not disturbed. Excess or unwanted imprint resist is removed by laser ablation in some embodiments. In other embodiments, the imprint resist is simply not dispensed on unwanted regions (e.g., by masking). In other embodiments, unwanted imprint resist is etched off (e.g., by plasma).

Because the region defining the edge 415 of the optical eyepiece layer 435 is free of the curable resist droplets, the optical performance of the optical waveguide is increased compared to traditional lithography methods. The scattering of light at the edge 415 of the optical eyepiece layer 435 is reduced compared to traditional lithography methods. Further, a number of particle defects on the zero RLT region (e.g., the edge 415) of the optical eyepiece layer 435 is reduced compared to traditional lithography methods.

Manufacturing of Optical Waveguide

Figure 5A:
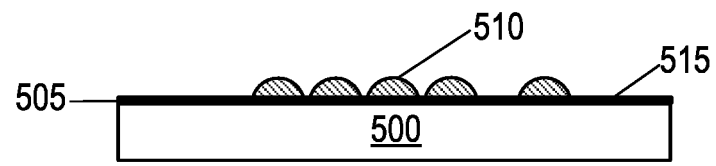
FIGS. 5A-E illustrate steps in a sequence of manufacturing an optical waveguide.

FIGS. 5A-E illustrate steps in a sequence of manufacturing an optical waveguide. Specifically, FIG. 5A illustrates a cross-sectional view of a substrate 500 and an adhesion promoting layer 505 deposited by a vapor deposition machine on the substrate 500. A fluid dispenser is configured to dispense the curable resist droplets 510 on the adhesion promoting layer 505 to form a diffraction grating. The adhesion promoting layer 505 is disposed between and directly contacts the substrate 500 and the dispensed curable resist droplets 510. A programmed resist drop pattern used for fabricating the optical waveguide corresponds to an optical eyepiece layer. The region 515 corresponding to an edge of the optical eyepiece layer is free of the curable resist droplets 510. The curable resist droplets 510 are therefore strategically injected on only a region of the optical eyepiece layer that is to be patterned into a diffraction grating.

The fluid dispenser is configured to dispense the curable resist droplets 510 on the adhesion promoting layer 505 at predefined coordinates and a predefined frequency to cause adjacent pairs of droplets to have a predefined separation on the adhesion promoting layer 505. The curable resist droplets 510 can be injected onto the adhesion promoting layer 505 by moving inkjet heads of the fluid dispenser, moving the substrate 500 across the inkjet heads, or moving the inkjet heads of the fluid dispenser and the substrate 500 across each other.

Figure 5B:
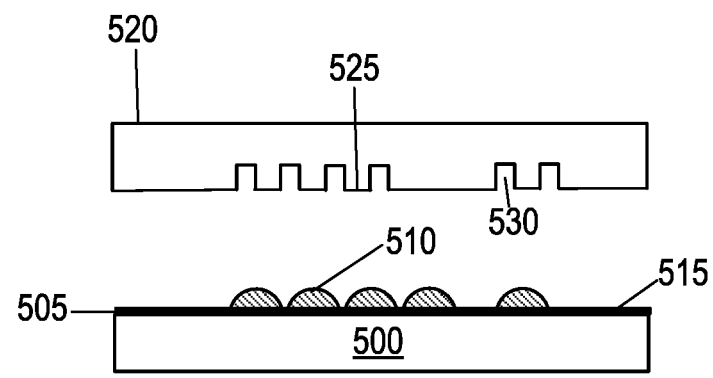

FIG. 5B illustrates a step in the sequence of manufacturing the optical waveguide. The components illustrated in FIG. 5B include the substrate 500, the adhesion promoting layer 505, the curable resist droplets 510, and a flexible, coated resist template 520. A controller (e.g., the controller 224 illustrated and described in more detail above with reference to FIG. 2B) is configured to superimpose the flexible, coated resist template 520 onto the curable resist droplets 510 to contact and pattern the curable resist droplets 510.

The flexible, coated resist template 520 includes a patterning surface comprising multiple recesses (e.g., recess 530) and protrusions (e.g., protrusion 525). In some embodiments, the protrusions 525 are associated with the resist drop pattern to minimize the striation of a virtual image caused by light exiting the optical eyepiece layer. In other embodiments, the pattern of the protrusions 525 is randomized. In other embodiments, the pattern of the protrusions 525 is geometric, e.g., circular or hexagonal. In some embodiments, the pattern of the protrusions 525 is associated with a density, and the pattern density of the protrusions 525 minimizes the striation of a virtual image. The pattern density of the protrusions 525 can include a quantity of the protrusions 525 included by the waveguide, or any sub-portion of the waveguide. That is, differing regions of the waveguide can include differing densities of protrusions 525 to minimize the striation of the virtual image. The flexible, coated resist template 520 can further include a deep grating structure or dam configured to prevent the curable resist droplets from flowing into the zero RLT region of the optical eyepiece layer. The zero RLT region corresponds to the region 515 corresponding to an edge of the optical eyepiece layer.

Figure 5C:
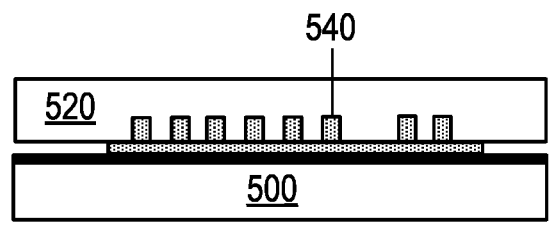

FIG. 5C illustrates a step in the sequence of manufacturing the optical waveguide. The components illustrated in FIG. 5C include the substrate 500, the patterned imprint resist 540, and the flexible, coated resist template 520. The controller 224 directs energy (e.g., broadband ultraviolet radiation) from an energy source (e.g., the energy source 122 of FIG. 2B above) to cure the patterned imprint resist 540.

Figure 5D:
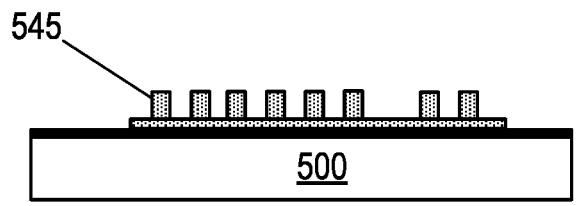

FIG. 5D illustrates a step in the sequence of manufacturing the optical waveguide. The components illustrated in FIG. 5D include the substrate 500 and the patterned and cured imprint resist 545. The flexible, coated resist template 520 shown above in FIG. 5C has been removed to expose a diffraction grating.

Figure 5E:
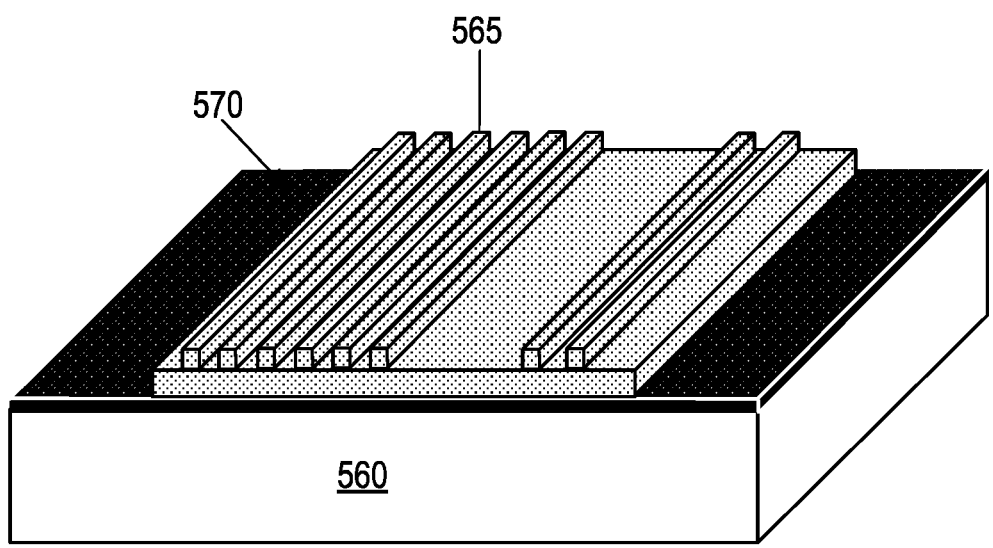

FIG. 5E illustrates a step in the sequence of manufacturing the optical waveguide. The components illustrated in FIG. 5E include a substrate 560, the exposed adhesion promoting layer 570, and the patterned and cured imprint resist 565. The diffraction grating illustrated in FIG. 5E conforms to a portion of the patterning surface of the flexible, coated resist template 520 shown in FIG. 5C. The optical eyepiece layer illustrated in FIG. 5E can be bonded to a second optical eyepiece layer imprinted on a second substrate to manufacture the optical waveguide. The optical eyepiece layer is bonded to the second optical eyepiece layer at the exposed adhesion promoting layer 570 disposed on the substrate 560. As illustrated in FIG. 5E, the exposed portion 570 of the adhesion promoting layer is free of the cured, patterned imprint resist 565.

Directing Laser Beam onto Edge of Optical Eyepiece Layer

Figure 6A:
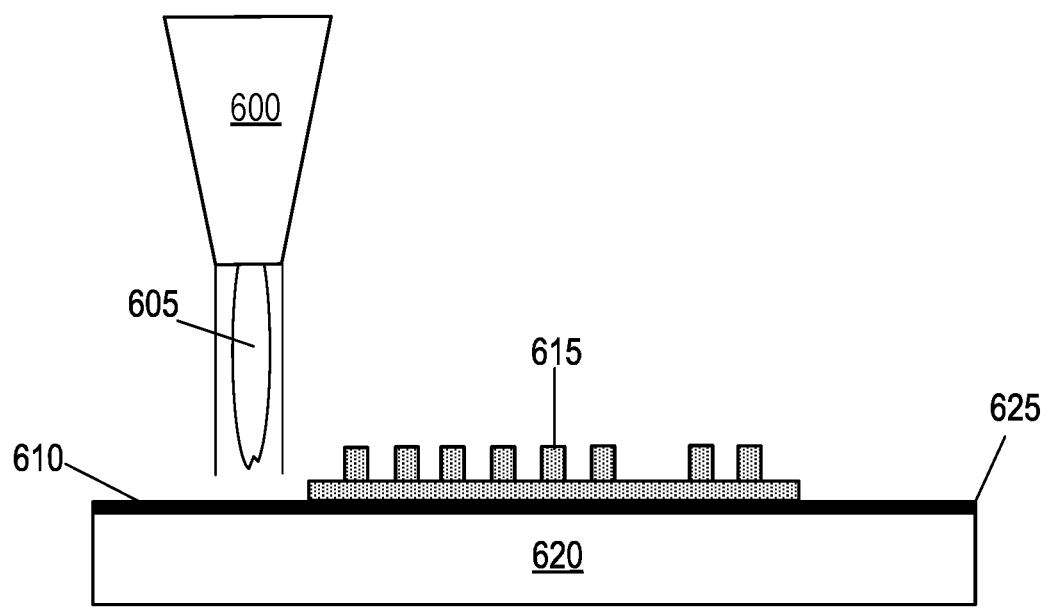
FIGS. 6A-B illustrate directing of a laser beam onto an edge of an optical eyepiece.

FIG. 6A illustrates the directing of a laser beam 605 onto an edge of an optical eyepiece layer. A controller (e.g., the controller 224 of FIG. 2A above) can be configured to direct the laser beam 605 from the laser 600 onto the exposed portion 610 of the adhesion promoting layer 625 to incise the optical eyepiece layer from the substrate 620. The optical eyepiece layer includes the cured, patterned imprint resist 615. The controller 224 maintains the laser beam 605 spaced laterally from the diffraction grating formed on the substrate 620. The laser beam 605 incises the optical eyepiece layer formed by the cured, patterned imprint resist 615 from the substrate 620. The controller 224 maintains a lateral spacing between the laser beam 605 and the cured, patterned imprint resist 615, such that the cured, patterned imprint resist 615 is not disturbed.

In some embodiments, the optical eyepiece layer is incised from the substrate 620 by pulsing the laser beam 605 onto the exposed portion 610 of the adhesion promoting layer 625 to generate nanoperforations in the substrate 620. In some embodiments, a high-frequency, low-power pulsed laser beam is used at a wavelength that transmits through the substrate 620. The pulsed laser beam can be focused to a point beneath a surface of the substrate 620. When the laser beam 605 hits a peak power density at the focal point, the substrate 620 absorbs the laser energy, and a pinpoint hole is created. The laser beam 605 can also cause compressive and tensile stress near the hole. As the laser beam 605 travels the length of the substrate 620, it perforates the substrate 620.

In some embodiments, a high-power laser beam 605 is applied to the generated nanoperforations to expand the nanoperforations and separate the optical eyepiece layer from the substrate 620. The sensitivity of the brittle substrate 620 to thermal fracture is used to perform the separation. A steady laser beam 605 is focused on the substrate 620 causing localized heating and thermal expansion. The expansion results in a crack that can be guided by moving the laser beam 605. The separation of the individual optical eyepiece layer occurs when the substrate 620 is expanded. The stress area introduced by laser processing provides the separation. A compressive stress around each nanoperforation can be bounded on top and bottom by spots of tensile stress, and the stress creates fissures along the path of the laser beam 605.

Figure 6B:
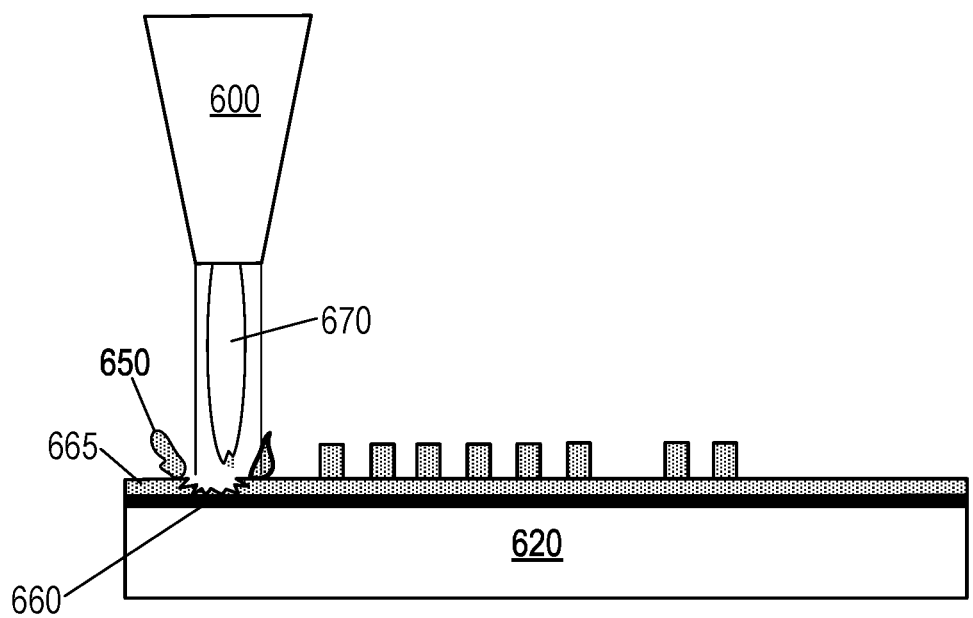

FIG. 6B illustrates an alternate scenario in which the imprint resist material 665 has been dispensed on an edge 660 of an optical eyepiece layer on the substrate 620. In this alternate scenario, the embodiments disclosed for manufacturing an optical waveguide by selective dispensing of curable resist droplets are not used. When a laser beam 670 from the laser 600 is directed onto the edge 660 of the optical eyepiece layer, particle defects 650 from the residual imprint resist 665 can form on the substrate 620. The particle defects 650 on the substrate 620 can occur when the laser beam 670 pulverizes the imprint resist material 665 in the cutting path (known as dicing street or kerf). In doing so, problems such as the debris 650 on the substrate 620, damage to the device, and loss of precious semiconductor material can occur. As a result, the optical structure can be damaged and/or become contaminated with the small (sub-micron) particle contaminants 650 (e.g., a small particle positioned on the substrate 620 can become lodged in the features of, or otherwise become adhered to, the optical structure).

Imprint defect-related high yield loss can be critical when such small particles 650 fall on sub-matter or product wafers at a non-pattern area. The size of such defects can be larger than the particle size due to imprint tenting effect. Such amplified imprint defects can serve as unexpected light scattering sources and may have to be quarantined. The dummy imprint resist 665 on top of the non-grating area 660, especially at the edge of eyepiece layers, can serve as a source of scattered light due to the non-uniformity and lower index. Uncontrolled scatter light can bounce back from the device functioning area and reduce the image quality.

Among other advantages and benefits, the embodiments disclosed herein (e.g., in FIG. 6A) reduce the scattering of light at the edge of the optical eyepiece layer compared to traditional lithography methods. Because there is no imprint resist material on the edge of the optical eyepiece layer, the laser beam 605 can make direct contact with the substrate 620. The sharpness of the optics is thereby improved compared to traditional lithography methods. Further, particle defects (e.g., 650) are reduced on the zero RLT region of the optical eyepiece layer compared to traditional lithography methods. By removing the dummy imprint resist from the non-imprint area, the formation of amplified imprint defects is reduced and product quality and optical performance is improved compared to traditional lithography methods.

Bonding Optical Eyepiece Layers

Figure 7A:
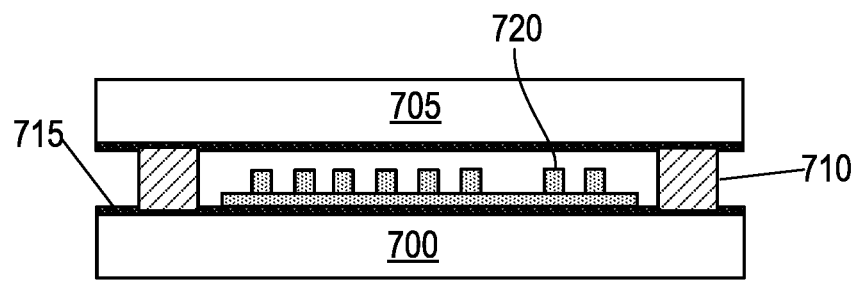
FIGS. 7A-B illustrate bonding of an optical eyepiece layer to a second optical eyepiece layer.

FIG. 7A illustrates the bonding of a first optical eyepiece layer imprinted on a first substrate 700 to a second optical eyepiece layer imprinted on a second substrate 705 to manufacture an optical waveguide. Bonding is used to manufacture the optical waveguide by joining separate components of a compound optical structure.

The manufactured waveguide shown in FIG. 7A intercepts light passing therethrough, e.g., from a source of light and provides total internal refraction of the light. In some embodiments, the waveguide facilitates the generation of a virtual content display. The waveguide is a multi-layered structure that includes a patterned layer, an adhesive layer, one or more substrates 700, 705, and an anti-reflective layer. The multi-layered optical structure formed can include waveguide supports (e.g., the bond 710). The waveguide support 710 connects and positions the multiple layers within the waveguide optical structure. To that end, the adhesive layer provides adhesion between the respective waveguide and the waveguide bond or support 710. The waveguide bond or support 710 can be made of such materials as acrylated resin or epoxy resin.

The first optical eyepiece layer imprinted on the substrate 700 includes a cured, patterned imprint resist layer 720. The cured, patterned imprint resist layer 720 does not cover an exposed portion 715 of an adhesion promoting layer disposed on the first substrate 700. In some embodiments, lamination glue is dispensed on the exposed portion 715, which corresponds to a zero RLT region of the first optical eyepiece layer. The zero RLT region of the first optical eyepiece layer is defined by the resist drop pattern preprogrammed in an inkjet program for the fluid dispenser 120 in accordance with the position of the stacking or lamination glue pattern. Therefore, the exposed portion 715 of the adhesion promoting layer is free of the imprint resist. The first optical eyepiece layer is bonded using the bond 710 (e.g., including stacking or lamination glue) to the second optical eyepiece layer imprinted on the second substrate 705 at the exposed portion 715 of the adhesion promoting layer disposed on the first substrate 700.

Figure 7B:
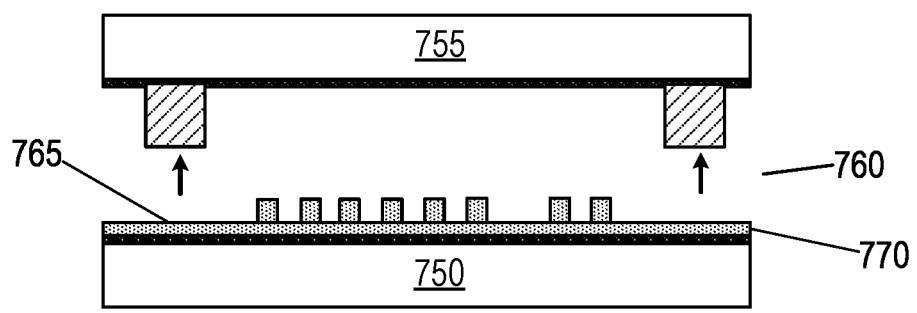

FIG. 7B illustrates an alternate scenario in which the embodiments for manufacturing an optical waveguide using selective deposition of curable resist droplets are not used. As shown in FIG. 7B, the imprint resist layer 770 covers the region 765 on the substrate 750. Therefore, the resulting bond 760 with the substrate 755 is weaker, leading to manufacturing and performance defects. For example, the imprint resist 770 on top of the non-grating pattern area 765, especially at the edge of an eyepiece layer, can react with the stacking glue material to reduce the adhesion and shear strength. When such stacked eyepieces shown in FIG. 7B are handled downstream to build a final product, delamination can occur and cause yield loss. The embodiments disclosed in FIG. 7A overcome such problems.

Among other advantages and benefits, the embodiments disclosed in FIG. 7A provide a mechanically stable and hermetically sealed encapsulation from the improved adhesion at the exposed portion 715 of the adhesion promoting layer disposed on the substrate 700 compared to traditional lithography methods. Other advantages resulting from the disclosed embodiments are that the bond 710 at the exposed portion of the adhesion promoting layer protects the sensitive internal optical structures from environmental influences and provides longer-term stability and reliability of the optical elements, compatibility with the surrounding periphery, and integrity of energy and information flow compared to traditional lithography methods.

Process of Manufacturing an Optical Waveguide

Figure 8:
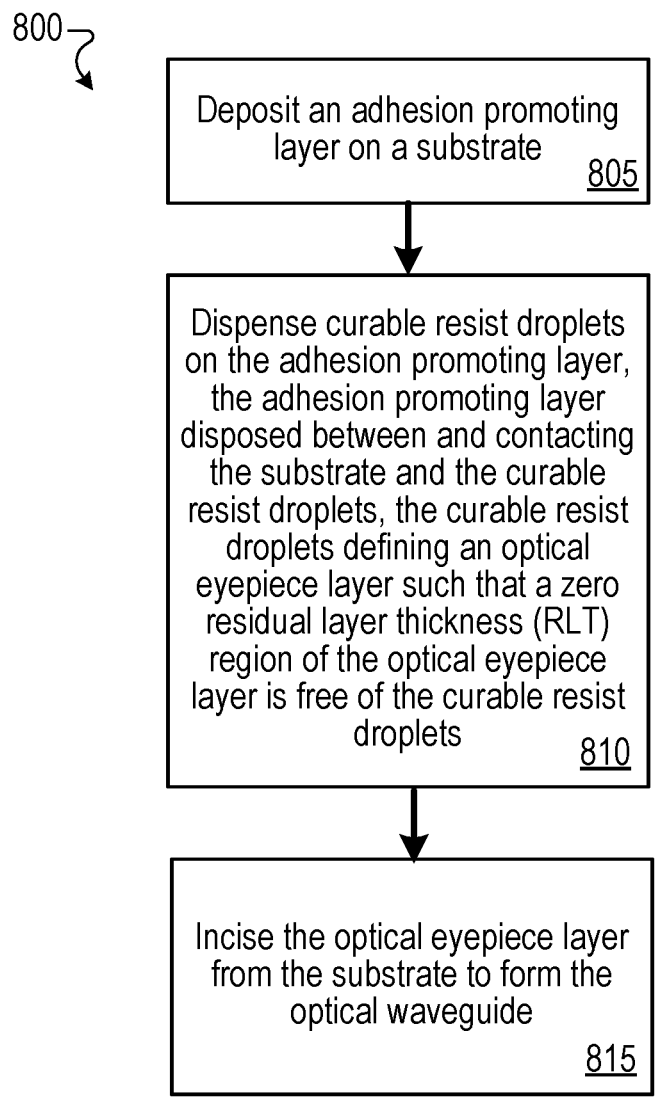
FIG. 8 illustrates a process of manufacturing an optical waveguide.

FIG. 8 illustrates a process 800 of manufacturing an optical waveguide by selective deposition of curable resist droplets. In some embodiments, the process 800 is performed by the lithography system 200 illustrated and described in more detail above with reference to FIG. 2B. The process 800 is illustrated as a collection of referenced acts arranged in a logical flow graph. The order in which the acts are described is not intended to be construed as a limitation, and any number of the described acts can be combined in other orders and/or in parallel to implement the process.

The lithography system 200 deposits 805 an adhesion promoting layer 505 on a substrate 500. The adhesion promoting layer 505 is intended to improve the adhesion of curable resist droplets 510 to the substrate 500. The adhesion promoting layer 505 can be applied by spinning a diluted solution on to the substrate 500 and allowing the layer 505 to spin dry.

The lithography system 200 dispenses 810 multiple curable resist droplets 510 on the adhesion promoting layer 505 to form a diffraction grating of the optical waveguide. The adhesion promoting layer 505 is disposed between and directly contacts the substrate 500 and the dispensed curable resist droplets 510. The curable resist droplets 510 define an optical eyepiece layer having an edge region 515. The edge region 515 corresponds to a zero RLT region of the optical eyepiece layer and is free of the curable resist droplets 510.

The lithography system 200 incises 815 the optical eyepiece layer from the substrate 500 to manufacture the optical waveguide. For example, the laser beam 605 from the laser 600 can be directed onto a portion of the adhesion promoting layer 505 to incise the optical eyepiece layer from the substrate 500, while maintaining the laser beam 605 spaced laterally from the cured, patterned imprint resist 545. By removing the imprint resist layer 545 from the non-pattern area 515, uncontrolled light scattering effects are reduced, improving optical performance such as sharpness compared to traditional lithography methods. Further, the disclosed embodiments can expose a ValMat™ monolayer coating as the adhesion promoter to the lamination glue, improving mechanical properties such as layer adhesion, shear strength, or bonding for stacked eyepieces and reducing the imprint defect formation compared to traditional lithography methods.

Further benefits and advantages of the embodiments disclosed herein are that they provide a simplified imprint lithography process having lower cost, higher throughput, and higher resolution compared to traditional lithography methods. A three-dimensional patterning process can be used and imprint molds can be fabricated having multiple layers of topography stacked vertically. The resulting imprints can replicate multiple layers with a single imprint step, which allows optics manufacturers to reduce particle defects and fabrication costs, and improve optical performance compared to traditional lithography methods.

The invention claimed is:

1. A method of manufacturing an optical waveguide, the method comprising:
    depositing an adhesion promoting layer on a substrate;
    dispensing a plurality of curable resist droplets on the adhesion promoting layer, the adhesion promoting layer disposed between and contacting the substrate and the plurality of curable resist droplets, the plurality of curable resist droplets defining an optical eyepiece layer such that a zero residual layer thickness (RLT) region of the optical eyepiece layer is free of the plurality of curable resist droplets; and
    incising the optical eyepiece layer from the substrate to form the optical waveguide, wherein incising of the optical eyepiece layer from the substrate comprises:
        pulsing a laser beam onto the adhesion promoting layer to generate nanoperforations in the substrate; and
        expanding the nanoperforations to separate the optical eyepiece layer from the substrate.

2. The method of claim 1, wherein the plurality of curable resist droplets are dispensed on the adhesion promoting layer at predefined coordinates and a predefined frequency, such that at least two adjacent droplets of the plurality of curable resist droplets have a predefined separation on the adhesion promoting layer.

3. The method of claim 1, wherein the fluid dispensing of the plurality of curable resist droplets comprises translating one or more inkjet heads of the fluid dispenser relative to the substrate.

4. The method of claim 1, further comprising:
    superimposing a coated resist template onto the plurality of curable resist droplets to contact and pattern the plurality of curable resist droplets, the coated resist template comprising a deep grating structure or dam configured to prevent the plurality of curable resist droplets from flowing into the zero RLT region of the optical eyepiece layer;

curing, by radiation, the plurality of curable resist droplets; and removing the coated resist template to expose a diffraction grating formed by the plurality of curable resist droplets.

5. The method of claim 1, further comprising:

instantiating a void fiducial on the substrate to monitor the dispensing of the plurality of curable resist droplets, wherein the void fiducial is defined by a resist drop pattern of the plurality of curable resist droplets; and instantiating a fiducial marker by superimposing a coated resist template onto the plurality of curable resist droplets to contact and pattern the plurality of curable resist droplets.

6. The method of claim 5, further comprising:

measuring an offset between the void fiducial and the fiducial marker; and aligning the zero RLT region of the optical eyepiece layer, by the measured offset, with a deep grating structure or dam located on the coated resist template, wherein the deep grating structure or dam corresponds to an edge of the optical eyepiece layer.

7. A method of manufacturing an optical waveguide, the method comprising:

depositing an adhesion promoting layer on a substrate;

dispensing a plurality of curable resist droplets on the adhesion promoting layer, the adhesion promoting layer disposed between and contacting the substrate and the plurality of curable resist droplets, the plurality of curable resist droplets defining an optical eyepiece layer such that a zero residual layer thickness (RLT) region of the optical eyepiece layer is free of the plurality of curable resist droplets; and incising the optical eyepiece layer from the substrate to form the optical waveguide, wherein incising of the optical eyepiece layer from the substrate comprises forming nanoperforations in the substrate.

8. The method of claim 7, wherein the plurality of curable resist droplets are dispensed on the adhesion promoting layer at predefined coordinates and a predefined frequency, such that at least two adjacent droplets of the plurality of curable resist droplets have a predefined separation on the adhesion promoting layer.

9. The method of claim 7, wherein the fluid dispensing of the plurality of curable resist droplets comprises translating one or more inkjet heads of the fluid dispenser relative to the substrate.

10. The method of claim 7, further comprising:

superimposing a coated resist template onto the plurality of curable resist droplets to contact and pattern the plurality of curable resist droplets, the coated resist template comprising a deep grating structure or dam configured to prevent the plurality of curable resist droplets from flowing into the zero RLT region of the optical eyepiece layer;

curing, by radiation, the plurality of curable resist droplets; and removing the coated resist template to expose a diffraction grating formed by the plurality of curable resist droplets.

11. The method of claim 7, further comprising:

instantiating a void fiducial on the substrate to monitor the dispensing of the plurality of curable resist droplets, wherein the void fiducial is defined by a resist drop pattern of the plurality of curable resist droplets; and instantiating a fiducial marker by superimposing a coated resist template onto the plurality of curable resist droplets to contact and pattern the plurality of curable resist droplets.

12. The method of claim 7, further comprising:

measuring an offset between the void fiducial and the fiducial marker; and aligning the zero RLT region of the optical eyepiece layer, by the measured offset, with a deep grating structure or dam located on the coated resist template, wherein the deep grating structure or dam corresponds to an edge of the optical eyepiece layer.

13. The method of claim 7, wherein incising of the optical eyepiece layer from the substrate comprises pulsing a laser beam onto the adhesion promoting layer to form the nanoperforations in the substrate.

14. The method of claim 13, further comprising expanding the nanoperforations to separate the optical eyepiece layer from the substrate.

15. The method of claim 7, further comprising:

instantiating a void fiducial on the substrate to monitor the dispensing of the plurality of curable resist droplets, wherein the void fiducial is defined by a resist drop pattern of the plurality of curable resist droplets; and instantiating a fiducial marker by superimposing a coated resist template onto the plurality of curable resist droplets to contact and pattern the plurality of curable resist droplets.

16. A method of manufacturing an optical waveguide, the method comprising:

depositing an adhesion promoting layer on a substrate;

dispensing a plurality of curable resist droplets on the adhesion promoting layer, the adhesion promoting layer disposed between and contacting the substrate and the plurality of curable resist droplets, the plurality of curable resist droplets defining an optical eyepiece layer such that a zero residual layer thickness (RLT) region of the optical eyepiece layer is free of the plurality of curable resist droplets; and incising the optical eyepiece layer from the substrate to form the optical waveguide, wherein incising of the optical eyepiece layer from the substrate comprises forming nanoperforations in the substrate with a laser beam.

17. The method of claim 16, wherein the plurality of curable resist droplets are dispensed on the adhesion promoting layer at predefined coordinates and a predefined frequency, such that at least two adjacent droplets of the plurality of curable resist droplets have a predefined separation on the adhesion promoting layer.

18. The method of claim 16, wherein the fluid dispensing of the plurality of curable resist droplets comprises translating one or more inkjet heads of the fluid dispenser relative to the substrate.

19. The method of claim 16, further comprising:

superimposing a coated resist template onto the plurality of curable resist droplets to contact and pattern the plurality of curable resist droplets, the coated resist template comprising a deep grating structure or dam configured to prevent the plurality of curable resist droplets from flowing into the zero RLT region of the optical eyepiece layer;

curing, by radiation, the plurality of curable resist droplets; and removing the coated resist template to expose a diffraction grating formed by the plurality of curable resist droplets.

* * * * *